(12) United States Patent
Qu

(10) Patent No.: US 12,240,987 B2
(45) Date of Patent: Mar. 4, 2025

(54) INK COMPOSITION FOR INKJET PRINTING, METHOD FOR PRODUCING DISPLAY DEVICE, AND DISPLAY DEVICE

(71) Applicant: SHARP KABUSHIKI KAISHA, Sakai (JP)

(72) Inventor: Yang Qu, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 51 days.

(21) Appl. No.: 18/028,660

(22) PCT Filed: Sep. 30, 2020

(86) PCT No.: PCT/JP2020/037108
§ 371 (c)(1),
(2) Date: Mar. 27, 2023

(87) PCT Pub. No.: WO2022/070296
PCT Pub. Date: Apr. 7, 2022

(65) Prior Publication Data
US 2023/0332007 A1  Oct. 19, 2023

(51) Int. Cl.
*C09D 11/38* (2014.01)
*C09D 11/106* (2014.01)
*C09D 11/52* (2014.01)
*H10K 71/13* (2023.01)
*H10K 85/10* (2023.01)
*H10K 85/60* (2023.01)
*B41M 5/00* (2006.01)
(Continued)

(52) U.S. Cl.
CPC ............ *C09D 11/38* (2013.01); *C09D 11/106* (2013.01); *C09D 11/52* (2013.01); *H10K 71/135* (2023.02); *H10K 85/111* (2023.02); *H10K 85/141* (2023.02); *H10K 85/636* (2023.02); *B41M 5/0047* (2013.01); *H10K 50/15* (2023.02); *H10K 50/16* (2023.02); *H10K 50/17* (2023.02); *H10K 85/653* (2023.02)

(58) Field of Classification Search
CPC ....... C09D 11/38; C09D 11/106; C09D 11/52; C09D 11/102; C09D 11/322; C09D 11/36; H10K 71/135; H10K 85/111; H10K 85/141; H10K 85/636; H10K 50/15; H10K 50/16; H10K 50/17; H10K 85/653; H10K 2102/331; H10K 71/15; B41M 5/0047; B41J 2/01; H05B 33/10
See application file for complete search history.

(56) References Cited

U.S. PATENT DOCUMENTS 10,388,902 B1 * 8/2019 Palles-Dimmock ............ H10K 50/115
2011/0306157 A1 * 12/2011 Wallace ............ H10K 71/13
438/34
(Continued)

FOREIGN PATENT DOCUMENTS

CN 103459521 A 12/2013
CN 103548171 A 1/2014
(Continued)

*Primary Examiner* — Mark Kopec
*Assistant Examiner* — Jaison P Thomas
(74) *Attorney, Agent, or Firm* — ScienBiziP, P.C.

(57) ABSTRACT

An ink composition for ink-jet printing includes a functional material and an alkylene glycol derivative, wherein the functional material includes OTPD.

7 Claims, 2 Drawing Sheets

(51) Int. Cl.
*H10K 50/15* (2023.01)
*H10K 50/16* (2023.01)
*H10K 50/17* (2023.01)

(56) References Cited

U.S. PATENT DOCUMENTS

| | | |
|---|---|---|
| 2013/0292661 A1 | 11/2013 | Nanno et al. |
| 2014/0008642 A1 | 1/2014 | Morita et al. |
| 2014/0084280 A1 | 3/2014 | Chiba et al. |
| 2015/0270485 A1* | 9/2015 | Watanabe ............... H10K 71/15 438/22 |
| 2016/0268526 A1 | 9/2016 | Facchetti et al. |
| 2018/0033984 A1 | 2/2018 | Luchinger et al. |
| 2019/0023930 A1 | 1/2019 | Swisher et al. |
| 2019/0229298 A1 | 7/2019 | Shi |
| 2019/0288230 A1 | 9/2019 | Kim et al. |
| 2019/0305240 A1* | 10/2019 | Angioni ................. H10K 50/15 |
| 2021/0126217 A1* | 4/2021 | Ryu ..................... H10K 50/115 |
| 2021/0217996 A1* | 7/2021 | Hamilton ............... H10K 71/15 |
| 2021/0328165 A1* | 10/2021 | Zampetti ............... H10K 50/15 |

FOREIGN PATENT DOCUMENTS

| | | |
|---|---|---|
| CN | 105131712 A | 12/2015 |
| CN | 107706315 A | 2/2018 |
| CN | 108711593 A | 10/2018 |
| CN | 109651886 A | 4/2019 |
| JP | 2013073810 A | 4/2013 |
| JP | 2018506857 A | 3/2018 |
| JP | 2019508515 A | 3/2019 |
| JP | 2019151814 A | 9/2019 |
| KR | 20150121355 A | 10/2015 |
| WO | 2012098577 A1 | 7/2012 |

\* cited by examiner

|  |  | Example 1 | Example 2 | Example 3 | Example 4 | Example 5 | Example 6 | Example 7 | Example 8 |
|---|---|---|---|---|---|---|---|---|---|
| Functional material (concentration) | Ni(Ac)$_2$ | 0.2 M |  |  |  |  | 0.2 M |  |  |
|  | OTPD |  | 9 mg/mL |  |  |  |  | 9 mg/mL |  |
|  | Poly-TPD |  |  | 10 mg/ml |  |  |  |  | 10 mg/ml |
|  | ZnO nanoparticle |  |  |  | 2.5 wt.% | 2.5 wt.% |  |  |  |
|  | NiO nanoparticle |  |  |  |  |  |  |  |  |
|  | ZnMgO nanoparticle |  |  |  |  |  |  |  |  |
| Solvent (volume ratio) | Propylene glycol | 1.5 | 2 | 1 | 1.5 | 3 |  |  |  |
|  | Ethylene glycol |  |  |  |  |  | 1 | 2 | 1 |
|  | Methylene glycol |  |  |  |  |  |  |  |  |
|  | Butylene glycol |  |  |  |  |  |  |  |  |
|  | PGMEA |  | 1 |  |  |  | 1.5 | 1 |  |
|  | 2-propanol | 1 | 2 |  | 1 | 1 |  | 2 |  |
|  | Chlorobenzene |  |  | 1 |  |  |  |  | 1 |
|  | Chloroform |  |  | 1 |  |  |  |  | 1 |
|  | Toluene |  |  |  |  |  |  |  |  |
|  | Ethanol |  |  |  |  |  |  |  |  |
| Binder (concentration) | PVP |  |  |  | 10 wt.% | 10 wt.% |  |  |  |
| Layer to be formed |  | Hole injection layer | Hole transport layer | Hole transport layer | Electron transport layer | Electron transport layer | Hole injection layer | Hole transport layer | Hole transport layer |
| Evaluation | Dispersibility | Uniform dispersion | Uniform dispersion | Uniform dispersion | Uniform dispersion | Uniform dispersion | Uniform dispersion | Uniform dispersion | Uniform dispersion |
|  | Stability | Good | Good | Good | Good | Good | Good | Good | Good |
|  | Ejection property | Good | Good | Good | Good | Good | Good | Good | Good |

|  |  | Example 9 | Example 10 | Example 11 | Comparative example 1 | Comparative example 2 | Comparative example 3 | Comparative example 4 |
|---|---|---|---|---|---|---|---|---|
| Functional material (concentration) | Ni(Ac)$_2$ |  |  |  | 0.2 M |  |  |  |
|  | OTPD |  |  |  |  | 9 mg/mL |  |  |
|  | Poly-TPD |  |  |  |  |  | 10 mg/ml |  |
|  | ZnO nanoparticle | 2.5 wt.% |  |  |  |  |  | 2.5 wt.% |
|  | NiO nanoparticle |  | 0.2 M |  |  |  |  |  |
|  | ZnMgO nanoparticle |  |  | 2.5 wt.% |  |  |  |  |
| Solvent (volume ratio) | Propylene glycol |  | 1.5 | 1.5 |  |  |  |  |
|  | Ethylene glycol | 1.5 |  |  |  |  |  |  |
|  | Methylene glycol |  |  |  |  |  |  |  |
|  | Butylene glycol |  |  |  |  |  |  |  |
|  | PGMEA |  |  |  |  |  |  |  |
|  | 2-propanol | 1 | 1 | 1 | 1 |  |  | 1 |
|  | Chlorobenzene |  |  |  |  | 1 | 1 |  |
|  | Chloroform |  |  |  |  |  |  |  |
|  | Toluene |  |  |  | 1 | 1 | 1 |  |
|  | Ethanol |  |  |  |  |  |  | 1 |
| Binder (concentration) | PVP | 10 wt.% |  |  |  |  |  |  |
| Layer to be formed |  | Electron transport layer | Hole injection layer | Electron transport layer | Hole injection layer | Hole transport layer | Hole transport layer | Electron transport layer |
| Evaluation | Dispersibility | Uniform dispersion | Uniform dispersion | Uniform dispersion | Non-uniform dispersion | Non-uniform dispersion | Non-uniform dispersion | Non-uniform dispersion |
|  | Stability | Good | Good | Good | Poor | Good | Good | Good |
|  | Ejection property | Good | Good | Good | Poor | Poor | Poor | Poor |

FIG. 2

INK COMPOSITION FOR INKJET PRINTING, METHOD FOR PRODUCING DISPLAY DEVICE, AND DISPLAY DEVICE

TECHNICAL FIELD

The disclosure relates to an ink composition for ink-jet printing, a method for manufacturing a display device, and a display device.

BACKGROUND ART

For example, PTL 1 discloses an ink composition for ink-jet printing for forming function layers such as a hole injection layer, a hole transport layer, and an electron transport layer using an ink-jet device.

CITATION LIST

Patent Literature

PTL 1: WO 2012/098577

SUMMARY

Technical Problem

However, when the ink composition for ink-jet printing is applied using the ink-jet device, a functional material needs to be uniformly dispersed in a solvent, which can be difficult to achieve.

A main object of the disclosure is to provide an ink composition for ink-jet printing with better dispersibility.

Solution to Problem

According to one aspect of the disclosure, an ink composition for ink-jet printing includes a functional material and an alkylene glycol derivative.

According to one aspect of the disclosure, a method for manufacturing a display device includes forming a charge transport function layer by applying and drying the ink composition for ink-jet printing described above.

According to one aspect of the disclosure, a display device includes a function layer made of the ink composition for ink-jet printing described above.

BRIEF DESCRIPTION OF DRAWINGS

FIG. 2 is a table showing compositions and the like of ink compositions for ink-jet printing of examples and comparative examples.

DESCRIPTION OF EMBODIMENTS

Figure 1:
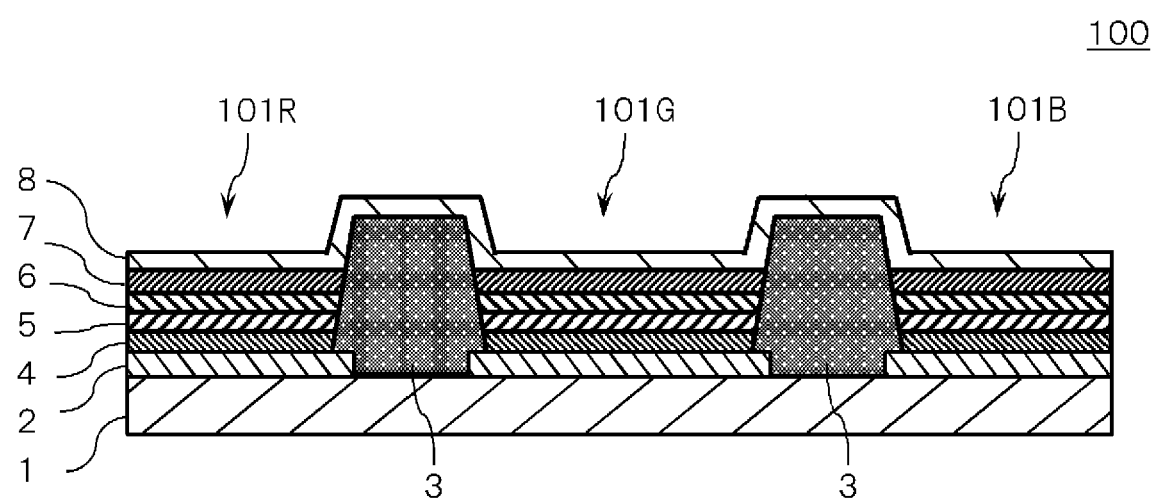
FIG. 1 is a diagram schematically illustrating an example of a layered structure of a display device according to a first embodiment.

An embodiment described below is a merely example of the disclosure. The disclosure is not limited in any way to the following embodiment.

First Embodiment

FIG. 1 is a diagram schematically illustrating an example of a layered structure of a display device 100 according to the present embodiment.

As illustrated in FIG. 1, the display device 100 includes, for example, a plurality of light-emitting elements 101R, 101G, and 101B in which an anode 2, a hole injection layer 4, a hole transport layer 5, a light-emitting layer 6, an electron transport layer 7, and a cathode S are provided in this order on a substrate 1. Each of the light-emitting elements 101R, 101G, and 101B are partitioned by a bank 3 provided on the substrate 1. The light-emitting element 101R emits red light. The light-emitting element 101G emits green light. The light-emitting element 101B emits blue light. For example, one pixel is composed of one set of the light-emitting elements 101R, 101G, and 101B that emit light in three colors. The display device 100 is configured, for example, by arranging a plurality of pixels in a matrix.

The display device 100 can be manufactured by layering individual layers on the substrate 1, for example.

Each of the hole injection layer 4, the hole transport layer 5, the light-emitting layer 6, and the electron transport layer 7 is a layer containing a functional material, and can be said to be a function layer.

The substrate 1 is, for example, a glass substrate or a flexible substrate including a resin film made of polyimide or the like, and functions as a support body that supports the individual layers described above. The substrate 1 may be, for example, an array substrate in which a thin film transistor (TFT) and the like are formed.

The anode 2 supplies positive holes to the light-emitting layer 6.

The cathode 8 supplies electrons to the light-emitting layer 6. The cathode 8 is provided to face the anode 2.

Either the anode 2 or the cathode 8 is made of a light-transmissive material. Either the anode 2 or the cathode 8 may be made of a light-reflective material. When the light-emitting elements 101R, 101G, and 101B are top-emitting light-emitting elements, for example, the cathode 8 being an upper layer is made of a light-transmissive material, and the anode 2 being a lower layer is made of a light-reflective material. When the light-emitting elements 101R, 101G, and 101B are bottom-emitting light-emitting elements, for example, the cathode 8 being an upper layer is made of a light-reflective material, and the anode 2 being a lower layer is made of a light-transmissive material. Alternatively, either the anode 2 or the cathode 8 may be a light-reflective electrode by being a layered body including a light-transmissive material and a light-reflective material.

As the light-transmissive material, a transparent conductive material can be used, for example. Specifically, for example, indium tin oxide (ITO), indium zinc oxide (IZO), tin oxide ($SnO_2$), or fluorine-doped tin oxide (FTO) can be used as the light-transmissive material. These materials have high visible light transmittance, thereby improving luminous efficiency of each light-emitting element 101.

As the light-reflective material, a metal material can be used, for example. Specifically, for example, aluminum (Al), silver (Ag), copper (Cu), or gold (Au) can be used as the light-reflective material. These materials have a high reflectivity of visible light, and thus luminous efficiency is improved.

The anode 2 and the cathode 8 can be formed by either of various known methods in the related art such as sputtering and vacuum vapor deposition technique. For example, when the anode 2 is made of ITO, the anode 2 can be formed by sputtering. For example, when the cathode 8 is made of Al, the cathode 8 can be formed by vacuum vapor deposition technique.

The light-emitting layer 6 is disposed between the anode 2 and the cathode 8 and emits light. The light-emitting layer 6 contains a luminescent material such as an organic luminescent material or quantum dots. The light-emitting layer 6, for example, emits light with a predetermined luminescent color by recombination of positive holes supplied from the anode 2 and electrons supplied from the cathode 8. That is, in the light-emitting layer 6, luminescent materials having different luminescent colors are used in correspondence with the light-emitting elements 101R, 101G, and 101B. The luminescent colors of the light-emitting elements 101R, 101G, and 10B depend on the luminescent colors of the light-emitting layer 6. The light-emitting layer 6 can be formed by, for example, an ink-jet printing method, a coating method, or vapor deposition technique. The luminescent material such as quantum dots in the light-emitting layer 6 can be regarded as a functional material. In the following description, the light-emitting elements 101R, 101G, and 101B are collectively referred to as the light-emitting element 101.

The hole transport layer 5 is disposed between the anode 2 and the light-emitting layer 6 and transports positive holes from the anode 2 to the light-emitting layer 6. The hole transport layer 5 contains a hole transport material that is a functional material.

The hole transport material can be appropriately selected from materials commonly used in this field, and examples thereof include organic hole transport materials and inorganic hole transport materials.

Examples of organic hole transport materials include 4,4',4"-tris(9-carbazoyl)triphenylamine (TCTA), 44'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), $MoO_3$, poly(N-vinylcarbazole) (PVK), poly(2,7-(9,9-di-n-octylfluorene)-(1,4-phenylene-((4-sec-butylphenyl)imino)-1,4-phenylene (TFB), N4,N4'-bis(4-6-((3-ethyloxetan-3-yl)methoxy)hexyl)phenyl)-N4,N4'-diphenylbiphenyl-4,4'-diamine (OTPI)), and poly[N,N-bis(4-butylphenyl)-N, N'-bis(phenyl)benzidine](Poly-TPD).

Examples of inorganic hole transport materials include a metal oxide that includes one or more materials selected from the group consisting of oxides, nitrides, and carbides containing one or more of Zn, Cr, Ni, Ti, Nb, Al, Si, Mg, Ta, Hf, Zr, Y, La, and Sr.

A thickness of the hole transport layer 5 is preferably 15 nm or more and 80 nm or less. When the thickness of the hole transport layer 5 is less than 15 nm, the hole transport properties of the hole transport layer 5 may be impaired. On the other hand, when the thickness of the hole transport layer 5 exceeds 80 nm, an increase in drive voltage in each light-emitting element 101 may occur, thereby causing a fine current.

The hole transport layer 5 can be formed by, for example, a coating method such as an ink-jet printing method, a spin coating method, or a dip coating method, a sol-gel method, sputtering, vacuum vapor deposition technique, or CVD, depending on the material to be formed.

The hole injection layer 4 is disposed between the anode 2 and the hole transport layer 5 and injects positive holes from the anode 2 into the hole transport layer 5. The hole injection layer 4 contains a hole transport material similar to that contained in the hole transport layer 5. The hole transport material in the hole injection layer 4 is appropriately selected in accordance with the materials of the anode 2 and the hole transport layer 5 so that the efficiency of transporting positive holes from the anode 2 to the light-emitting layer 6 is high. The materials of the hole injection layer 4 and the hole transport layer 5 are preferably different from each other.

A thickness of the hole injection layer 4 is preferably 15 nm or more and 100 nm or less. When the thickness of the hole injection layer 4 is less than 15 nm, the hole injection properties of the hole injection layer 4 may be impaired. On the other hand, when the thickness of the hole injection layer 4 exceeds 100 nm, the uniformity of the thickness of the hole injection layer 4 may be impaired, which may reduce the hole injection efficiency into the hole transport layer 5.

The hole injection layer 4 can be formed by, for example, a coating method such as an ink-jet method, a spin coating method, or a dip coating method, a sol-gel method, sputtering, vacuum vapor deposition technique, or CVD, depending on the material to be formed.

In each light-emitting element 101 of the present embodiment, the hole transport layer 5 and the hole injection layer 4 are not essential components. For example, a configuration in which the anode 2 and the light-emitting layer 6 are in direct contact without the hole transport layer 5 and the hole injection layer 4 may be employed, or a configuration in which the anode 2, the hole transport layer 5, and the light-emitting layer 6 are layered without the hole injection layer 4 may be employed.

The electron transport layer 7 is disposed between the cathode 8 and the light-emitting layer 6 and transports electrons from the cathode 8 to the light-emitting layer 6. The electron transport layer 7 contains an electron transport material that is a functional material.

The electron transport material can be appropriately selected from materials commonly used in this field. Examples of the electron transport material include compounds and complexes containing one or more nitrogen-containing heterocycles such as oxadiazole ring, triazole ring, triazine ring, quinoline ring, phenanthroline ring, pyrimidine ring, pyridine ring, imidazole ring, and carbazole ring. Specific examples of the electron transport material include 1,10-phenanthroline derivatives such as bathocuproine and bathophenanthroline; benzimidazole derivatives such as 1,3,5-tris(N-phenylbenzimidazol-2-yl)benzene (TPBI); metal complexes such as bis(10-benzoquinolinolato)beryllium complex, 8-hydroxyquinoline Al complex, bis(2-methyl-8-quinolinato)-4-phenylphenolate aluminum; and 4,4-bis(carbazole)biphenyl. Other examples of the electron transport material include aromatic boron compounds, aromatic silane compounds, aromatic phosphine compounds such as phenyldi(1-pyrenyl)phosphine, and nitrogen-containing heterocyclic compounds such as bathophenanthroline, bathocuproine, and triazine derivatives.

The electron transport layer 7 can be formed by, for example, a coating method such as an ink-jet printing method, a spin coating method, or a dip coating method, a sol-gel method, sputtering, vacuum vapor deposition technique, or CVD depending on the material to be formed.

In each light-emitting element 101 of the present embodiment, the electron transport layer 7 is not an essential component. For example, the cathode 8 and the light-emitting layer 6 may be in direct contact without the electron transport layer 7.

Hereinafter, an ink composition for ink-jet printing that can be a material to form each of the hole injection layer 4, the hole transport layer 5, and the electron transport layer 7 by an ink-jet printing method will be described.

The ink composition for ink-jet printing includes a functional material and an alkylene glycol derivative. The ink composition for ink-jet printing is, for example, a liquid in which the functional material is dissolved or dispersed in a solvent. As long as the ink composition for ink-jet printing is a liquid, a shape of the functional material is not limited and may be solid, liquid, powder, or particles such as nanoparticles. When the ink composition for ink-jet printing is a disperse system in which the functional material is dispersed, the solvent can be referred to as a dispersion medium.

The alkylene glycol derivative is, for example, at least one selected from propylene glycol, methylene glycol, ethylene glycol, and butylene glycol. These alkylene glycol derivatives may be used alone or in combination. The alkylene glycol derivative can function as, for example, a solvent or a dispersion medium. The alkylene glycol derivative can improve the dispersibility of the functional material in the ink composition for ink-jet printing, thereby improving the stability of the ink composition over time. Further, the alkylene glycol derivative can, for example, favorably adjust the viscosity and surface tension of the ink composition for ink-jet printing in accordance with an ink-jet printer.

The ink composition for ink-jet printing may contain a solvent other than the alkylene glycol derivative. The solvent is selected according to a type of functional material. Further, the solvent is preferably compatible with the alkylene glycol derivative.

For example, when the functional material is at least one selected from nickel oxide (NiO) and nickel acetate ($Ni(Ac)_2$), the preferred solvent is 2-propanol.

For example, when the functional material is OTPD, the preferred solvent is propylene glycol monomethyl ether acetate (PGMEA). With this PGMEA, the ink composition for ink-jet printing can be manufactured without heating OTPD or irradiating OTPD with ultrasonic waves.

For example, when the functional material is a polymer such as Poly-TPD or TFB, the solvent that dissolves the polymer is preferred. This can further improve the dispersibility of the functional material in the ink composition for ink-jet printing. For example, when the functional material is Poly-TPD, the preferred solvent is chlorobenzene and chloroform.

Further, the ink composition for ink-jet printing may contain, for example, a binder resin. Examples of the binder resin include polyvinyl pyrrolidone (PVP) and polyethylene glycol (PEG). In particular, when the functional material is inorganic particles of zinc oxide (ZnO), zinc magnesium oxide (ZnMgO), or the like, the binder resin can further improve the dispersibility of the inorganic particles in the ink composition for ink-jet printing, thereby further improving the stability of the ink composition over time.

Each of the hole injection layer 4, the hole transport layer 5, and the electron transport layer 7 are formed by, for example, applying an ink composition for ink-jet printing to the region partitioned by the bank 3 via an ink-jet printing method and drying the ink composition. The individual layers are formed in order from a lower layer to an upper layer. In the display device 100 according to the present embodiment, at least one layer of the hole injection layer 4, the hole transport layer 5, and the electron transport layer 7 may be made of the ink composition for ink-jet printing. The ink composition for ink-jet printing is applied by, for example, being ejected from an ink ejecting nozzle in the ink-jet printer.

The Z value indicated by the following expression is preferably within a range from 1 to 14, $$(d \cdot \rho \cdot \gamma)^{1/2} \eta$$

where $\rho(g/m^3)$ is the density, $\gamma(mN \cdot m)$ is the surface tension, and $\eta$ (mPa·s) is the viscosity of the ink composition for ink-jet printing, and d (n) is the nozzle diameter of an ink ejecting nozzle. By setting the Z value of the ink composition for ink-jet printing within this range, the ink composition for ink-jet printing can be easily ejected by the ink-jet printer. The ejection velocity of the ink composition for ink-jet printing in the ink-jet printer can be adjusted as appropriate.

By containing the alkylene glycol derivative in the ink composition for ink-jet printing in the present embodiment, the functional material can be uniformly dispersed without using, for example, a surfactant or the like, thereby further improving the stability of the ink composition over time. Further, the viscosity and surface tension of the ink composition for ink-jet printing can be favorably adjusted.

In addition, since the display device is manufactured using the ink composition for ink-jet printing described above, adverse effects in each function layer, particularly due to residual surfactants or the like, are reduced. Thus, each good function layer can be easily formed, thereby constituting a display device having excellent light-emitting performance and at low-cost. Further, since the individual layers can be made of the ink-jet printing compositions having different functional materials, the ink-jet printing method can be used to form the hole injection layer, the hole transport layer, the light-emitting layer, and the electron transport layer in the manufacturing process of the display device.

In the above description, the anode 2, the hole injection layer 4, the hole transport layer 5, the light-emitting layer 6, the electron transport layer 7, and the cathode 8 are layered in this order on the substrate 1, but the layering order on the substrate 1 may be reversed.

Examples and Comparative Examples

Hereinafter, more specific compositions of the ink composition for ink-jet printing and evaluation results thereof will be described. FIG. 2 is a table showing compositions and evaluation results of ink compositions for ink-jet printing according to Examples and Comparative Examples. The dispersibility of each functional material in the ink composition for ink-jet printing, the stability of the ink composition for ink-jet printing, and the ejection property of the ink composition for ink-jet printing were evaluated. Regarding the stability, "Good" indicates that a sample was stable for ten hours or more keeping homogeneous or the like, and "Poor" indicates that precipitation or the like occurred within ten hours. Regarding the ejection property, "Good" indicates that the ink composition for ink-jet printing was able to be ejected by an ink-jet printer, and "Poor" indicates that the ink composition was unable to be ejected.

First Example

The ink composition for ink-jet printing in this example is a composition for forming the hole injection layer 4.

The ink composition for ink-jet printing was prepared according to the composition shown in the table in FIG. 2. Specifically, nickel acetate ($Ni(Ac)_2$), propylene glycol, and 2-propanol were mixed, and irradiated with ultrasonic waves for 20 minutes to obtain an ink composition for ink-jet printing. In the obtained ink composition for ink-jet printing, nickel acetate was uniformly dispersed. The obtained ink composition for ink-jet printing showed excellent stability, with no deposition of nickel acetate observed even after 72 hours. The ink composition for ink-jet printing of this example was able to be ejected by the ink-jet printer.

Second Example

The ink composition for ink-jet printing in this example is a composition for forming the hole transport layer 5.

The ink composition for ink-jet printing was prepared according to the composition shown in the table in FIG. 2. Specifically, OTPD was added dropwise to a mixed solvent of propylene glycol, propylene glycol monomethyl ether acetate (PGMEA) and 2-propanol, and the mixture was stirred to obtain an ink composition for ink-jet printing. In the obtained ink composition for ink-jet printing, OTPD was uniformly dissolved. The obtained ink composition for ink-jet printing showed excellent stability, with no inhomogeneous even after 72 hours. The ink composition for ink-jet printing of this example was able to be ejected by the ink-jet printer.

Example 3

The ink composition for ink-jet printing in this example is a composition for forming the hole transport layer 5.

The ink composition for ink-jet printing was prepared according to the composition shown in the table in FIG. 2. Specifically, Poly-TPD dissolved in chlorobenzene was mixed with propylene glycol, chloroform was added thereto, and the mixture was stirred and passed through a 0.2 μm PTFE filter to obtain an ink composition for ink-jet printing. In the obtained ink composition for ink-jet printing, Poly-TPD was uniformly dissolved. The obtained ink composition for ink-jet printing showed excellent stability, with no inhomogeneous even after 72 hours. The ink composition for ink-jet printing of this example was able to be ejected by the ink-jet printer.

Example 4

The ink composition for ink-jet printing in this example is a composition for forming the electron transport layer 7.

The ink composition for ink-jet printing was prepared according to the composition shown in the table in FIG. 2. Specifically, zinc oxide nanoparticles, polyvinyl pyrrolidone, 2-propanol, and propylene glycol were mixed and irradiated with ultrasonic waves for five minutes to obtain an ink composition for ink-jet printing. In the obtained ink composition for ink-jet printing, the zinc oxide nanoparticles were uniformly dispersed. The obtained ink composition for ink-jet printing showed excellent stability, with no deposition of zinc oxide nanoparticles even after 72 hours. The ink composition for ink-jet printing of this example was able to be ejected by the ink-jet device.

Example 5

The ink composition for ink-jet printing in this example is a composition for forming the electron transport layer 7. In this example, the volume ratio of the solvents in Example 4 was changed.

The ink composition for ink-jet printing was prepared according to the composition shown in the table in FIG. 2. Specifically, zinc oxide nanoparticles, polyvinyl pyrrolidone, 2-propanol, and propylene glycol were mixed and irradiated with ultrasonic waves for ten minutes to obtain an ink composition for ink-jet printing. In the obtained ink composition for ink-jet printing, the zinc oxide nanoparticles were uniformly dispersed. The obtained ink composition for ink-jet printing showed excellent stability, with no deposition of zinc oxide nanoparticles even after 72 hours. The ink composition for ink-jet printing of this example was able to be ejected by the ink-jet device.

Example 6

The ink composition for ink-jet printing in this example was the same as in Example 1, except that the solvents and the volume ratio of the solvents were changed.

An ink composition for ink-jet printing was prepared in the same manner as in Example 1 according to the composition shown in the table in FIG. 2. In the obtained ink composition for ink-jet printing, nickel acetate was uniformly dissolved. The obtained ink composition for ink-jet printing showed excellent stability, with no inhomogeneous observed even after 72 hours. The ink composition for ink-jet printing of this example was able to be ejected by the ink-jet printer.

Example 7

The ink composition for ink-jet printing in this example was the same as in Example 2, except that propylene glycol was replaced with ethylene glycol.

An ink composition for ink-jet printing was prepared in the same manner as in Example 2 according to the composition shown in the table in FIG. 2. In the obtained ink composition for ink-jet printing, OTP) was uniformly dispersed. The obtained ink composition for ink-jet printing showed excellent stability, with no separation of OTPD even after 72 hours. The ink composition for ink-jet printing of this example was able to be ejected by the ink-jet printer.

Example 8

The ink composition for ink-jet printing in this example was the same as in Example 3, except that propylene glycol was replaced with ethylene glycol.

An ink composition for ink-jet printing was prepared in the same manner as in Example 3 according to the composition shown in the table in FIG. 2. In the obtained ink composition for ink-jet printing, Poly-TPD was uniformly dissolved. The obtained ink composition for ink-jet printing showed excellent stability, with no inhomogeneous even after 72 hours. The ink composition for ink-jet printing of this example was able to be ejected by the ink-jet printer.

Example 9

The ink composition for ink-jet printing in this example was the same as in Example 4, except that propylene glycol was replaced with ethylene glycol An ink composition for ink-jet printing was prepared in the same manner as in Example 4 according to the composition shown in the table in FIG. 2. In the obtained ink composition for ink-jet printing, the zinc oxide nanoparticles were uniformly dispersed. The obtained ink composition for ink-jet printing showed excellent stability, with no inhomogeneous even after 72 hours. The ink composition for ink-jet printing of this example was able to be ejected by the ink-jet printer.

Example 10

The ink composition for ink-jet printing in this example is a composition for forming the hole injection layer 4.

The ink composition for ink-jet printing was prepared according to the composition shown in the table in FIG. 2. In the obtained ink composition for ink-jet printing, the NiO nanoparticles were uniformly dispersed. The obtained ink composition for ink-jet printing showed excellent stability, with no inhomogeneous even after 72 hours. The ink composition for ink-jet printing of this example was able to be ejected by the ink-jet printer.

Example 11

The ink composition for ink-jet printing in this example was the same as in Example 4, except that the ZnO nanoparticles were replaced with ZnMgO nanoparticles.

The ink composition for ink-jet printing was prepared according to the composition shown in the table in FIG. 2. In the obtained ink composition for ink-jet printing, the ZnMgO nanoparticles were uniformly dispersed. The obtained ink composition for ink-jet printing showed excellent stability, with no inhomogeneous even after 72 hours. The ink composition for ink-jet printing of this example was able to be ejected by the ink-jet printer.

Comparative Example 1

The ink composition for ink-jet printing in this comparative example was the same as in Example 1, except that the solvent was changed.

An ink composition for ink-jet printing was obtained in the same manner as in Example 1 according to the composition shown in the table in FIG. 2. However, after standing still for approximately ten hours, precipitated of nickel acetate occurred, thereby reducing stability of the ink composition. In other words, it was difficult to use this ink composition as an ink composition for ink-jet printing, and difficult to eject the ink composition by the ink-jet printer.

Comparative Example 2

The ink composition for ink-jet printing in this comparative example was the same as in Example 2, except that the solvent was changed.

An ink composition for ink-jet printing was obtained in the same manner as in Example 2 according to the composition shown in the table in FIG. 2. However, although the ink composition for ink-jet printing in this comparative example was stable, the ink composition was not able to be ejected by the ink-jet printer.

Comparative Example 3

The ink composition for ink-jet printing in this comparative example was the same as in Example 3, except that the solvent was changed.

An ink composition for ink-jet printing was obtained in the same manner as in Example 3 according to the composition shown in the table in FIG. 2. However, although the ink composition for ink-jet printing in this comparative example was stable, the ink composition was not able to be ejected by the ink-jet printer.

Comparative Example 4

The ink composition for ink-jet printing in this comparative example was the same as in Example 4, except that the solvent was changed.

An ink composition for ink-jet printing was obtained in the same manner as in Example 4 according to the composition shown in the table in FIG. 2. However, although the ink composition for ink-jet printing in this comparative example was stable, the ink composition was not able to be ejected by the ink-jet printer.

The disclosure is not limited to the embodiment described above, and may be substituted with a configuration that is substantially the same as the configuration described in the embodiment described above, a configuration that achieves the same action and effect, or a configuration capable of achieving the same object.

The invention claimed is:

1. An ink composition for ink-jet printing comprising:
   a functional material; and
   an alkylene glycol derivative,
   wherein the functional material includes OTPD (N4,N4'-bis(4-6-((3-ethyloxetan-3-yl)methoxy)hexyl)phenyl)-N4,N4'-diphenylbiphenyl-4,4'-diamine), and
   the alkylene glycol derivative is at least one selected from the group consisting of propylene glycol, methylene glycol, ethylene glycol, and butylene glycol.

2. The ink composition for ink-jet printing according to claim 1, further comprising 2-propanol.

3. The ink composition for ink-jet printing according to claim 1,
   wherein the functional material is at least one of nickel oxide and nickel acetate.

4. The ink composition for ink-jet printing according claim 1, further comprising:
   propylene glycol monomethyl ether acetate (PGMEA).

5. A method for manufacturing a display device, the method comprising:
   forming a function layer by applying and drying the ink composition for ink-jet printing according to claim 1.

6. A display device comprising:
   at least one function layer made of the ink composition for ink-jet printing according to claim 1.

7. The display device according to claim 6,
   wherein the at least one function layer includes at least one of a hole injection layer, a hole transport layer, and an electron transport layer.

* * * * *